(12) United States Patent  
Matsumura

(10) Patent No.: US 7,361,031 B2  
(45) Date of Patent: Apr. 22, 2008

(54) PRINTED CIRCUIT BOARD ASSEMBLY AND METHOD OF PRODUCING THE SAME

(75) Inventor: Kaoru Matsumura, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/783,021

(22) Filed: Apr. 5, 2007

(65) Prior Publication Data

US 2007/0270001 A1 Nov. 22, 2007

(30) Foreign Application Priority Data

May 17, 2006 (JP) .............................. 2006-137359

(51) Int. Cl.  
*H01R 12/00* (2006.01)
(52) U.S. Cl. .......................................... 439/82; 29/845
(58) Field of Classification Search .................. 439/82; 29/837–839, 841–845  
See application file for complete search history.

(56) References Cited

U.S. PATENT DOCUMENTS 5,890,284 A * 4/1999 Chartrand et al. ............ 29/853
5,896,655 A * 4/1999 Knodler ........................ 29/884
5,960,537 A * 10/1999 Vicich et al. .................. 29/843
2004/0078964 A1* 4/2004 Itou et al. ...................... 29/840
2005/0250356 A1* 11/2005 Matsumura et al. .......... 439/82
2005/0277312 A1* 12/2005 Nakamura .................... 439/82

FOREIGN PATENT DOCUMENTS

JP          2005-123048          5/2005

* cited by examiner

*Primary Examiner*—Ross Gushi  
(74) *Attorney, Agent, or Firm*—Kratz, Quintos & Hanson, LLP

(57) ABSTRACT

A printed circuit board assembly is formed by a press-fit connector attached to a printed circuit board. The press-fit connector includes a plurality of press-fit terminals and a housing. An overlapping resist part is formed on the printed circuit board. The overlapping resist part closely contacts the housing, and is arranged in a circular shape at an outer circumference of a through hole. By dipping the housing and the overlapping resist part closely contacting each other into a synthetic resin bath, the synthetic resin is filled in an inside of the through hole and a space surrounded by the overlapping resist part, and swarf of the press-fit terminal is fixed in the synthetic resin.

4 Claims, 9 Drawing Sheets

$P_1 = P_2 = P_3 \ ( = p \cdot g \cdot h )$ $\begin{pmatrix} p = \text{SPECIFIC GRAVITY} \\ \quad\ \ \text{OF LIQUID} \\ g = \text{GRAVITATIONAL} \\ \quad\ \ \text{ACCELERATION} \\ h = d \end{pmatrix}$

PRINTED CIRCUIT BOARD ASSEMBLY AND METHOD OF PRODUCING THE SAME

CROSS REFERENCE TO RELATED APPLICATIONS

This application is on the basis of Japanese Patent Application No. 2006-137359, the contents of which are hereby incorporated by reference.

BACKGROUND OF THE INVENTION

1. Field of the Invention

The present invention relates to a printed circuit board assembly having a printed circuit board with a press-fit connector and a method of producing the printed circuit board assembly, in particular, for preventing swarf of a terminal of the press-fit connector, which is generated when the terminal of the press-fit connector is pressed into a through hole of the printed circuit board, from adhering to other conductor of the printed circuit board assembly.

2. Description of the related art

Conventionally, when mounting an electric component having a pin-shaped terminal on a printed circuit board, for example, the terminal is inserted into a hole penetrated through the printed circuit board, and brazed for closing the hole so that the terminal is electrically connected to conductive patterns formed on a surface of the printed circuit board. On the other hand, recently, a press-fit connection has received attention instead of a brazing connection.

In the press-fit connection, a terminal and a through hole, namely a conductive pattern are electrically connected to each other by press-fitting the terminal having a resiliently deformable part into the plated through hole penetrating a printed circuit board (See Japanese Published Patent Application No. 2005-123048). When using the press-fit connection, a space on the board for brazing is not necessary. Therefore, the press-fit connection allows the terminals to be arranged with a small pitch, namely, allows the printed circuit board to be in a high density arrangement, and allows an assembling workability to be increased.

However, in the press-fit connection, when the terminal is pressed into the through hole, a plated layer formed on the surface of the terminal is scraped and swarf is generated. The swarf may be attached to the other conductive part to cause a leak.

Accordingly, an object of the present invention is to provide a printed circuit board assembly and a method of producing the same to prevent swarf from causing leak by preventing the swarf from floating, said swarf generated when a terminal is press-fitted into a printed circuit board.

SUMMARY OF THE INVENTION

In order to attain the object, according to the present invention, there is provided a printed circuit board assembly including:

a printed circuit board having conductive patterns formed on an insulating board, and a through hole connected to the conductive pattern;

a press-fit connector having a press-fit terminal to be pressed into the through hole for being electrically connected to the conductive pattern, and a housing for receiving the press-fit terminal;

an overlapping resist part formed on a press-fitting side of the printed circuit board where a resist for protecting the conductive patterns is overlapped with at least an outer edge of a circular conductive part surrounding the through-hole; and synthetic resin for filling an inside of the through hole and a space surrounded by the resist in a state that the press-fit connector is attached to the printed circuit board, and the housing and the overlapping resist part closely contact each other.

Preferably, the circular conductive part is formed by a metal plating part extending to the press-fitting side of the printed circuit board from the inside of the through hole.

Preferably, the circular conductive part is formed by the conductive pattern surrounding an outer circumference of the through hole.

According to another aspect of the present invention, there is provided a method for producing a printed circuit board assembly, said printed circuit board assembly including:

a printed circuit board; and a press-fit connector said printed circuit board having conductive patterns formed on an insulating board and a through hole electrically connected to the conductive patterns, a resist for protecting the conductive patterns and an overlapping resist part overlapping with at least an outer edge of a circular conductive part surrounding the through hole, said press-fit connector having a press-fit terminal to be pressed into the through hole for being electrically connected to the conductive pattern, and a housing for receiving the press-fit terminal, said method including the steps of:

making the overlapping resist part closely contact the housing by attaching the press-fit connector on a side where the overlapping resist part of the printed circuit board is mounted;

filling an inside of the through hole and a space surrounded by the overlapping resist part with liquid synthetic resin by dipping the printed circuit board and the press-fit connector attached to each other in a liquid synthetic resin bath in a direction from the printed circuit board to the press-fit connector;

curing the synthetic resin adhering to the printed circuit board and the press-fit connector attached to each other after pulling up the printed circuit board and the press-fit connector from the liquid synthetic resin bath.

These and other objects, features, and advantages of the present invention will become more apparent upon reading of the following detailed description along with the accompanied drawings.

DETAILED DESCRIPTION OF THE PREFERRED EMBODIMENTS

A printed circuit board assembly 1 according to a first embodiment of the present invention will be explained with reference to FIGS. 1 to 7.

Figure 1:
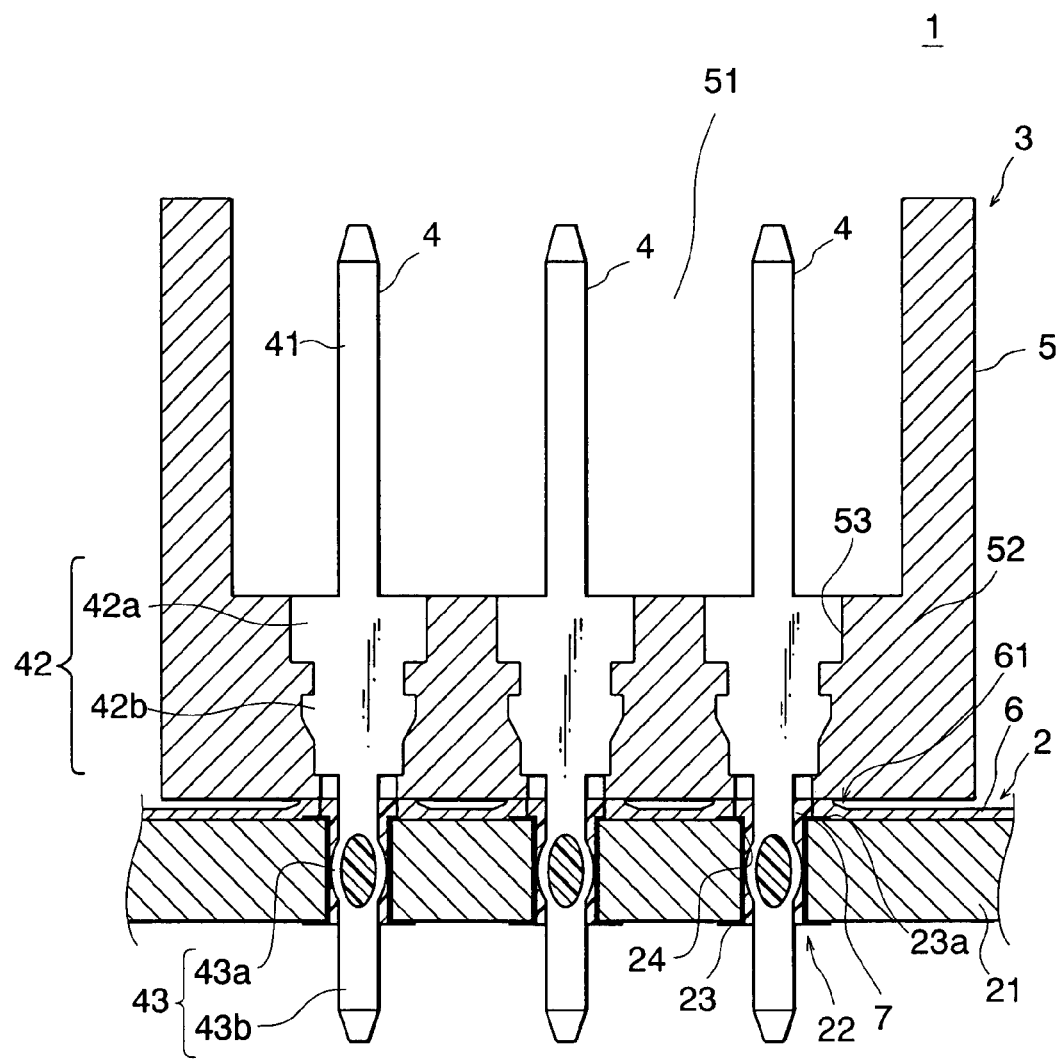
FIG. 1 is a sectional view showing a printed circuit board assembly according to a first embodiment of the present invention.

As shown in FIG. 1, the printed circuit board assembly 1 is formed by attaching a press-fit connector 3 to a printed circuit board 2. This printed circuit board 2 includes an insulating board 21 made of insulating synthetic resin, conductive patterns (not shown) wired according to a predetermined pattern on the insulating board 21, a through hole part 22 electrically connected to the conductive pattern, a resist 6 formed on the insulating board 21, and an overlapping resist part 61.

The through hole part 22 includes a through hole 24 penetrating the insulating board 21, and a metal plated part 23 formed on an inside of the through hole 24, and an outer circumference of the through hole 24 disposed on a surface of the insulating board 21. Further, an extracted part 23a of the metal plated part 23 is a part extracted to the surface of the insulating board 21 into which a later-described press-fit terminal 4 is pressed. The extracted part 23a is formed higher than the surface of the insulating board 21. The extracted part 23a is electrically connected to the conductive pattern. Further, the through hole part 22 is a part into which a press-fit part 43 of the press-fit terminal 4 is inserted, and having a proper size for resiliently deforming a later-described main part 43a of the press-fit part 43.

The resist 6 is made of insulating synthetic resin, formed in a sheet shape, and disposed in a manner that the conductive patterns are interposed between the resist 6 and the insulating board 21. The resist 6 is provided for purposes of protecting the conductive patterns, isolating the respective conductive patterns, preventing the conductive patterns from removing, and the like. In the present invention, the resist 6 composes the overlapping resist part 61 explained later and works as a sealing material for filling a space between the printed circuit board 2 and a later-described housing 5 of the press-fit connector 3.

Figure 3:
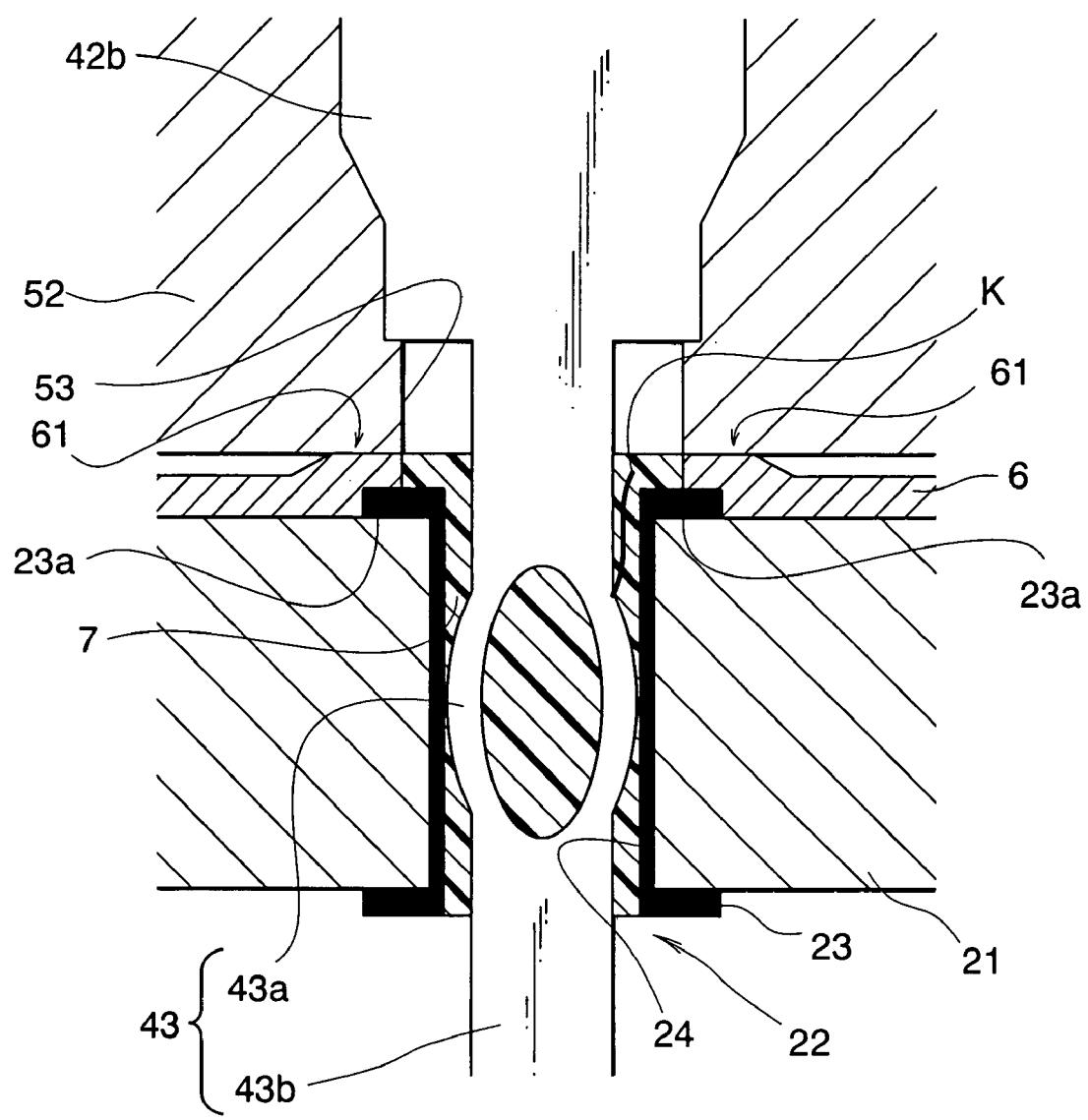
FIG. 3 is an enlarged view showing a contact between a press-fit connector and a printed circuit board.

As shown in FIG. 3, the overlapping resist part 61 is a part where the resist 6 is overlapped with an outer edge of the extracted part 23a. The extracted part 23a is formed in a ring shape on an outer circumference of the through hole 24, and the overlapping resist part 61 overlapped with the extracted part 23a is also formed in a ring shape. The overlapping resist part 61 is formed higher than the other part of the printed circuit board 2 by a height of the extracted part 23a. When the later-described press-fit connector 3 is attached to the printed circuit board 2, the overlapping resist part 61 closely contacts the housing 5 of the press-fit connector 3. Then, by the overlapping resist part 61 closely contacting the housing 5, a space surrounded by the overlapping resist part 61 is separated from an outside of the overlapping resist part 61. Incidentally, the extracted part 23a is a circular conductive part in claims.

The press-fit connector 3 includes a plurality of press-fit terminals 4 to be pressed into the through hole parts 22 of the printed circuit board 2, and the housing 5 receiving the press-fit terminals 4.

The housing 5 is made of insulating synthetic resin. A fitting part 51 to be fitted with a not-shown housing of a mating connector is formed on an upper wall of the housing 5 shown at an upper side of FIG. 1. A terminal fixing part 52 for fixing the press-fit terminals 4 is formed at an inner middle part of the housing 5. The printed circuit board 2 is disposed at a bottom wall of the housing 5 shown in a lower part of FIG. 1.

The terminal fixing part 52 is a bask wall disposed at a backside of the fitting part 51, and has a plurality of through holes 53 for press-fitting the terminals. Each through hole 53 has a step to stop the press-fit terminal 4 inserted from the fitting part 51 at a predetermined position. Namely, the press-fit terminal 4 is pressed into and fixed at the through hole 53. Incidentally, according to the present invention, the press-fit terminal 4 may be formed in the housing 5 by an insert molding.

Figure 2:
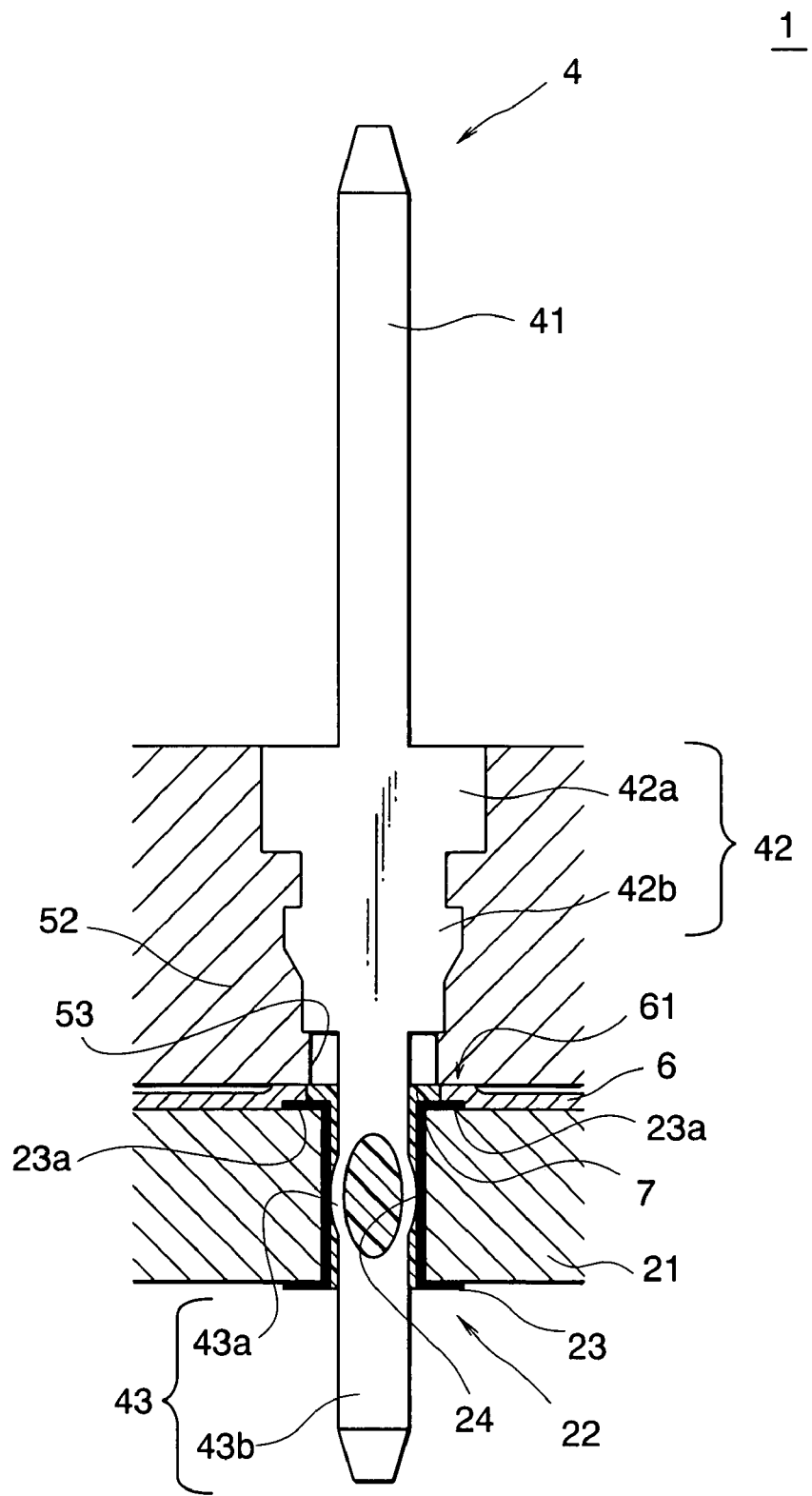
FIG. 2 is an enlarged view showing a main part of the printed circuit board assembly shown in FIG. 1.

The press-fit terminal 4 is made of metal, and a plating layer is formed on a surface of the press-fit terminal 4 for protection against oxidation. As shown in FIG. 2, the press-fit terminal 4 includes a connector contact part 41, a fixing part 42, and the press-fit part 43, and formed, for example, in a substantially pin shape.

When the press-fit terminal 4 is fixed on the housing 5, the connector contact part 41 projects toward the fitting part 51 and contacts a connector terminal of a mating connector.

The fixing part 42 is formed in the middle of the press-fit terminal 4. When the press-fit terminal 4 is fixed on the housing 5, the fixing part 42 is pressed into the through hole 53 of the terminal fixing part 52. An abutting part 42a for abutting on the step of the through hole 53 and a retaining part 42b for biting into an inner wall of the through hole 53 are formed on the fixing part 42.

The press-fit part 43 is inserted into the printed circuit board 2. An oval shaped resilient main body 43a disposed at the fixing part 42, and a pin-shaped guiding part 43b extended from and disposed at a tip of the main body 43a are formed on the press-fit part 43.

When the guiding part 43b of the press-fit terminal 4 is inserted into the through hole part 22 of the printed circuit board 2, and the main body 43a is pressed into the through hole through hole part 22, the press-fit connector 3 is mechanically fixed to the printed circuit board 2, and the press-fit terminal 4 is electrically connected to the metal plated part 23, namely, the conductive pattern. Further, when the press-fit connector 3 is attached to the printed circuit board 2, the bottom wall of the housing 5 closely contacts the overlapping resist part 61.

In the printed circuit board assembly 1, synthetic resin 7 is filled in an inside of the through hole part 22 into which the main body 43a of the press-fit terminal 4 is pressed, and the space surrounded by the overlapping resist part 61. The synthetic resin 7 is mainly made of polyolefin, or acrylic resin which are generally used as a moistureproof material. The synthetic resin 7 works as a moistureproof, and prevents swarf K (shown in FIG. 3) from adhering to the other conductive part by fixing the swarf K. The swarf K is generated by shaving a plated layer formed on a surface of the press-fit terminal 4 when the press-fit terminal 4 is pressed into the through hole part 22.

Figure 4:
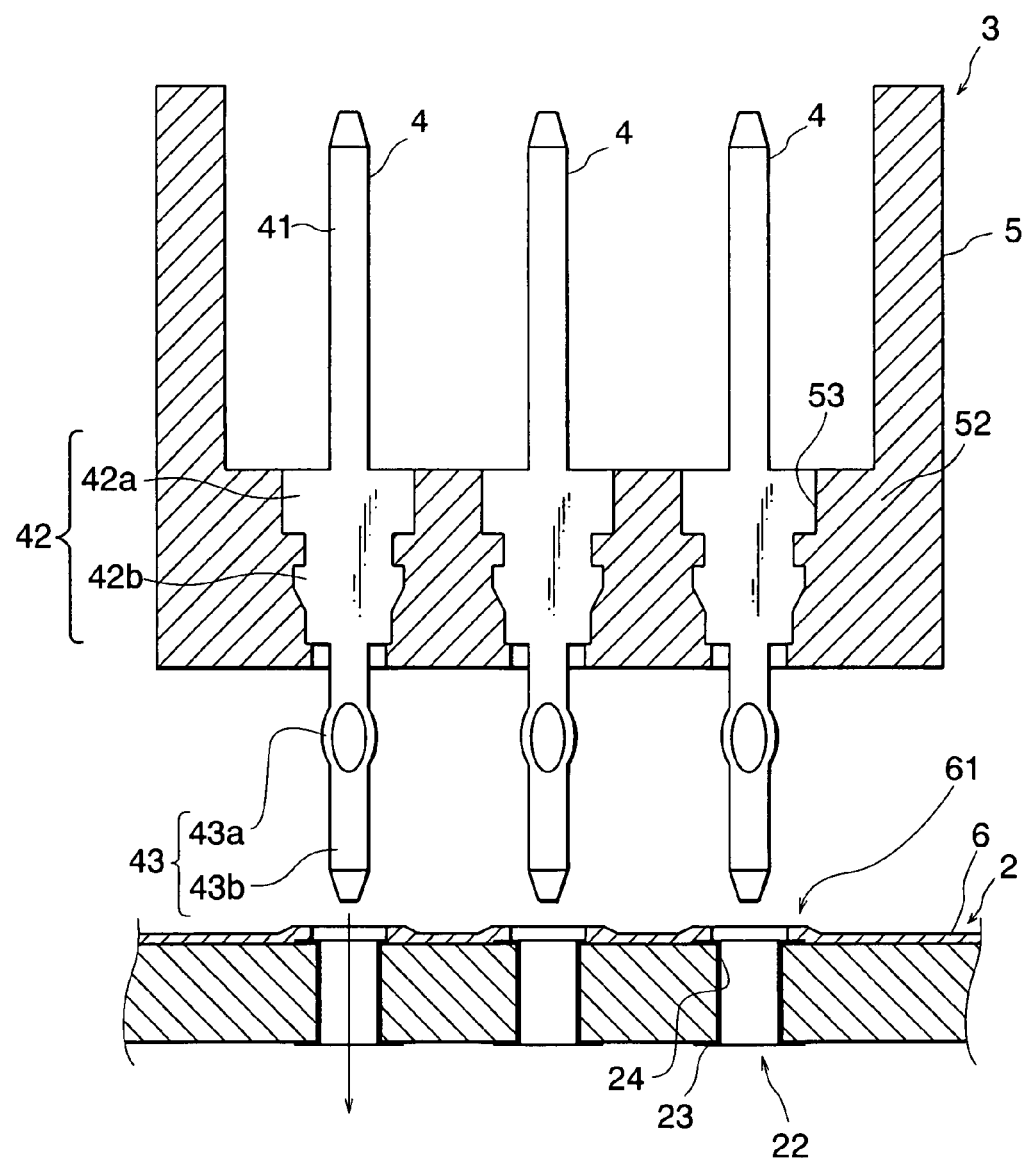
FIG. 4 is an explanatory view explaining a method of producing the printed circuit board assembly shown in FIG. 1, and a sectional view showing the press-fit connector attached to the printed circuit board.

The printed circuit board assembly 1 is produced as follows. First, as shown in FIG. 4, the press-fit connector 3 is attached to a surface of the printed circuit board 2 where the overlapping resist part 61 is mounted so that the overlapping resist part 61 and the housing 5 of the press-fit connector 3 closely contact each other.

Figure 5:
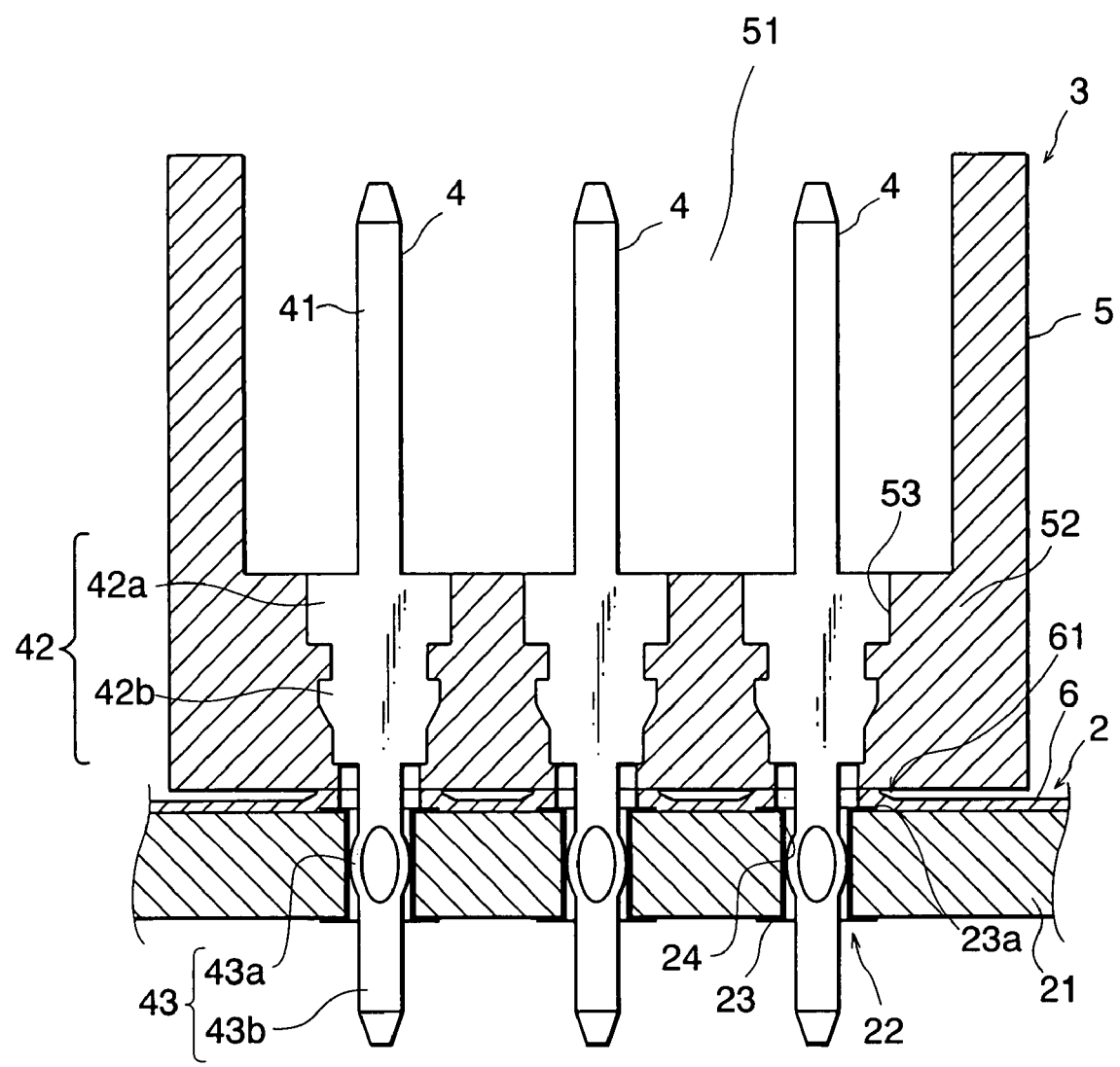
FIG. 5 is a sectional view showing the press-fit connector and the printed circuit board shown in FIG. 4 attached to each other.
Figure 6:
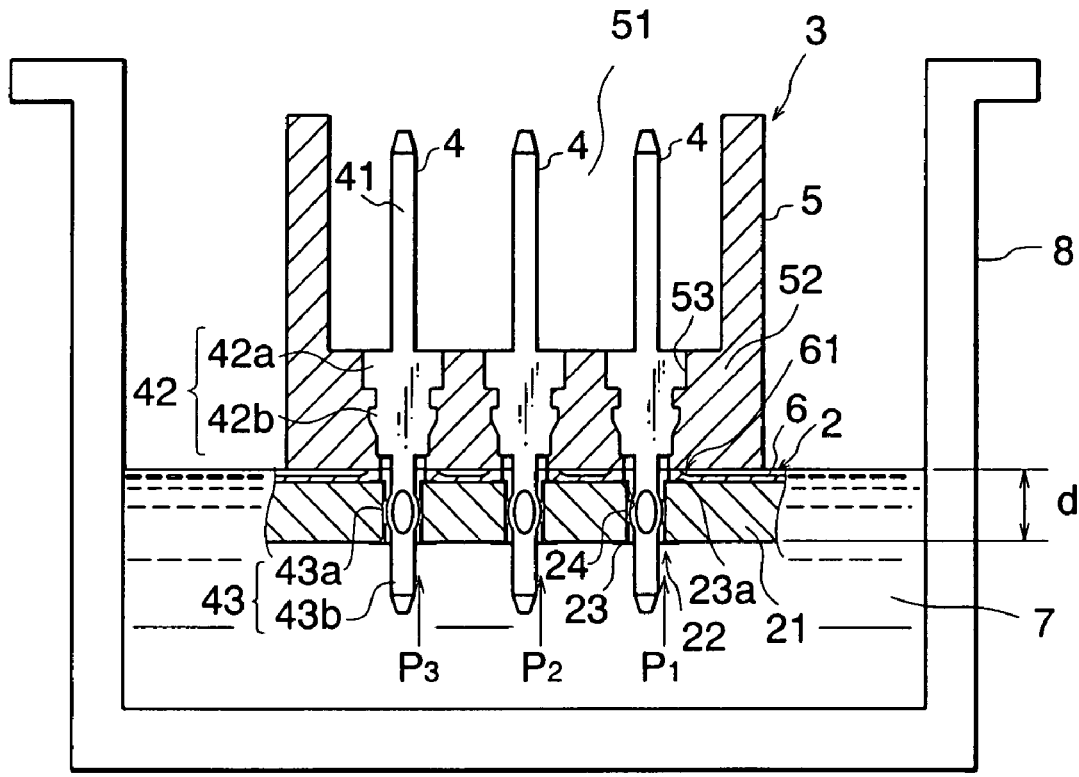
FIG. 6 is a sectional view showing the press-fit connector and the printed circuit board attached to each other shown in FIG. 5 dipping into a liquid synthetic resin bath.

Next, the printed circuit board 2 and the press-fit connector 3 attached to each other as shown in FIG. 5 are dipped into a bath 8 storing the liquid synthetic resin 7 melted in solvent in a direction from the printed circuit board 2 to the press-fit connector 3 as the through hole part 22 are parallel to a surface of solutions as shown in FIG. 6. At this time, they are dipped to a depth d where an abutting surface of the housing 5 and the overlapping resist part 61 is at the same height as a liquid surface of the bath 8. Then, liquid pressure corresponding to the depth d acts on openings of the through hole parts 22 at a bottom side of FIG. 6, and the synthetic resin 7 enters all the through hole parts 22 equally and simultaneously (shown by arrows $P_1$ to $P_3$). Dipping time in the path 8 is determined by the dipping depth d, a sectional area of the through hole part 22, temperature and viscosity of the liquid synthetic resin 7, a type of solvent, and the like. Thus, the synthetic resin 7 is filled in the inside of the through hole part 22 and the space surrounded by the overlapping resist part 61.

Figure 7:
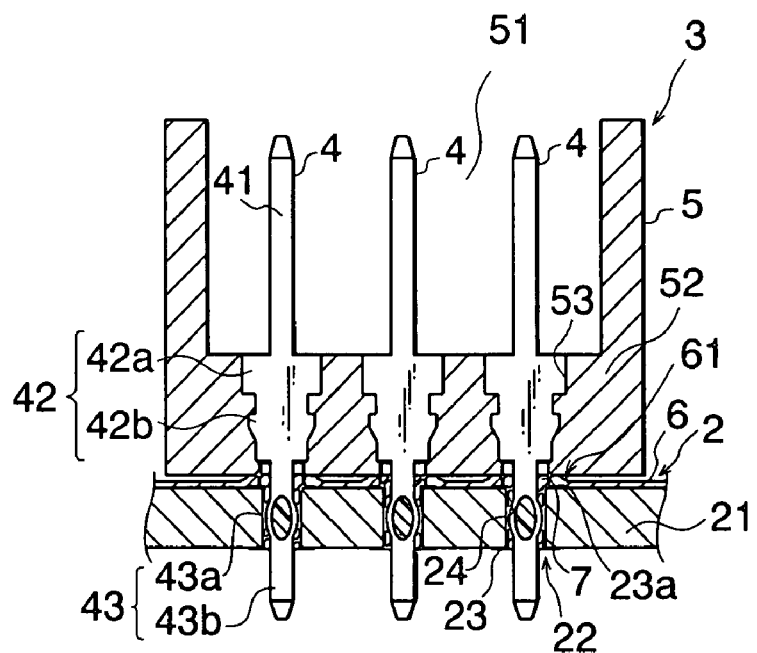
FIG. 7 is a sectional view showing the press-fit connector and the printed circuit board attached to each other shown in FIG. 6 pulled up from the bath.
Figure 7:
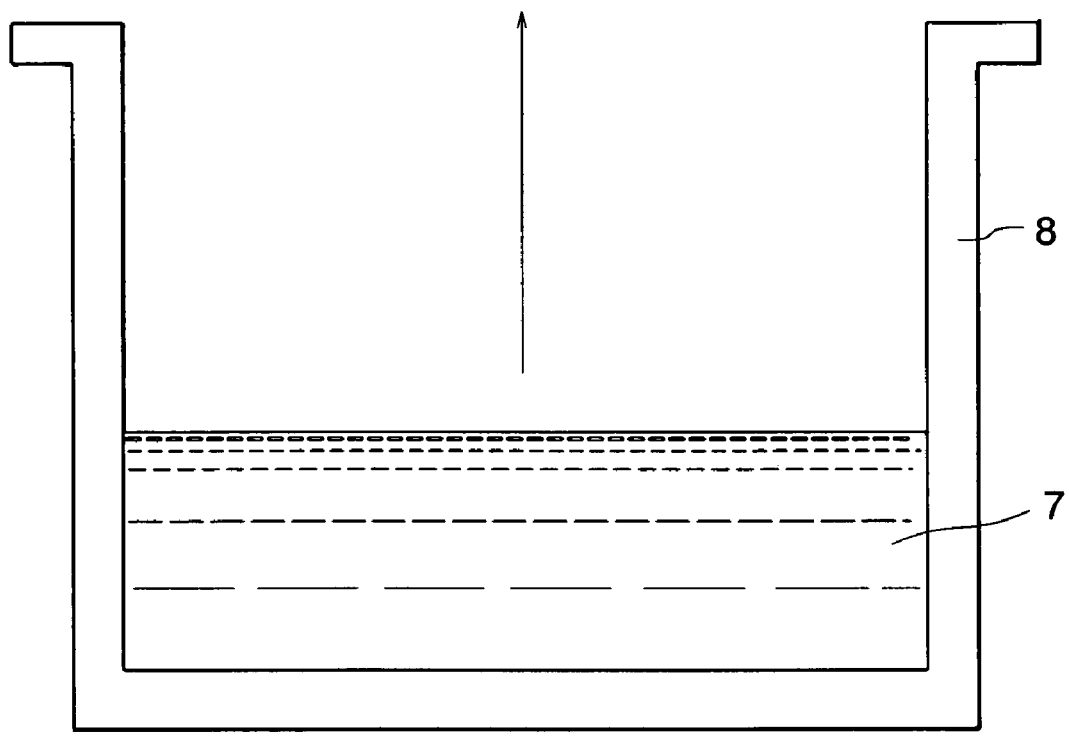

Further, as shown in FIG. 7, after the printed circuit board 2 and the press-fit connector 3 attached to each other are pulled up from the bath 8, the solvent of the synthetic resin 7 adhering to them are volatilized, so that the synthetic resin 7 is solidified including the swarf K. Thus, the printed circuit board assembly 1 is produced.

According to the present embodiment, the synthetic resin 7 is filled in the inside of the through hole part 22 and the space surrounded by the overlapping resist part 61 in a state that the overlapping resist part 61 of the printed circuit board 2 and the housing 5 of the press-fit connector 3 closely contact each other. Therefore, the synthetic resin 7 is sealed in the overlapping resist part 61 without overflowing from a space between the printed circuit board 2 and the housing 5, and filled in the inside of the through hole part 22 and the space surrounded by the overlapping resist part 61. By dipping in the bath 8 from the printed circuit board 2 to the press-fit connector 3, the synthetic resin 7 is filled into all of the through hole parts 22 equally and simultaneously with an action of the liquid pressure. The synthetic resin 7 fixes the swarf K to prevent the swarf K from adhering to the other conductive parts and to prevent leak.

Thus, the extracted part 23a composing the overlapping resist part 61 is necessary for composing the through hole part 22. A space of the printed circuit board 2 is reduced by using the height of the extracted part 23a.

Next, a second embodiment of a printed circuit board assembly 1' according to the present invention will be explained with reference to FIGS. 8 and 9.

Figure 8:
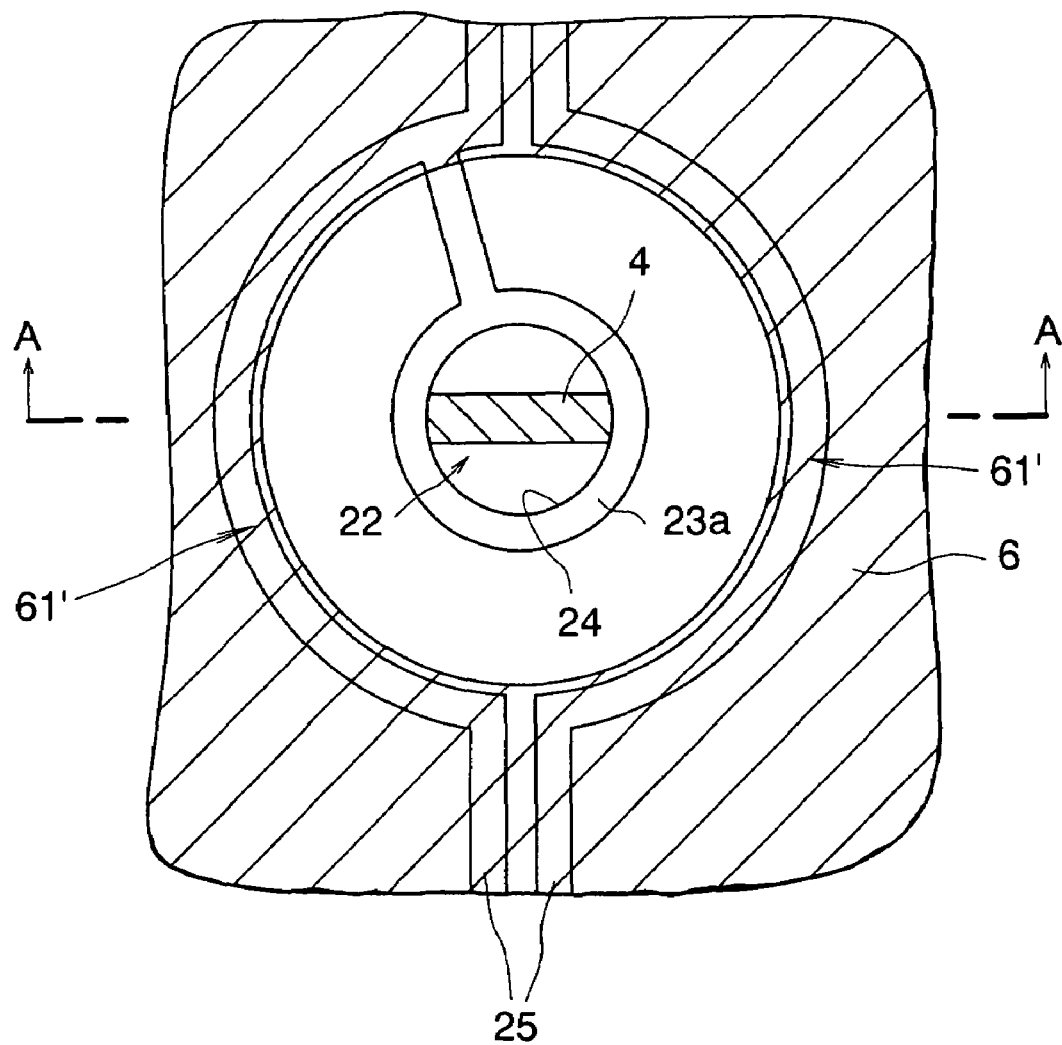
FIG. 8 is a schematic view explaining an overlapping resist part of a printed circuit board assembly according to a second embodiment of the present invention.
Figure 9:
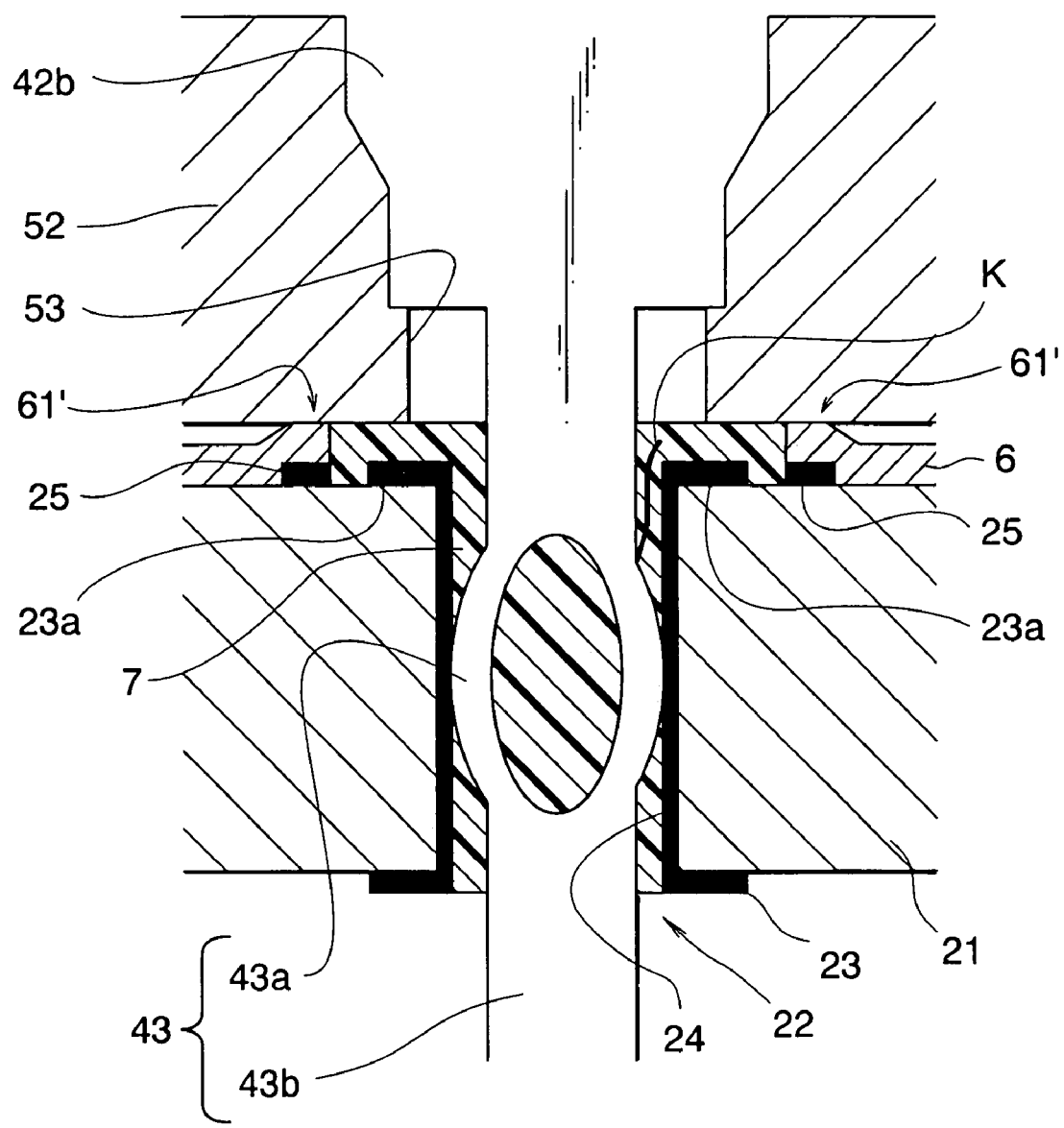
FIG. 9 is a sectional view taken on line A-A of FIG. 8.

As shown in FIGS. 8 and 9, an overlapping resist part 61' according to the present invention is composed of a conductive pattern 25 arranged on the insulating board 21 and the resist 6. The conductive pattern 25 is formed in a circular shape at an outside of the extracted part 23a. The conductive pattern 25 is a circular conductor in claims. Overlapping the resist 6 with the conductive pattern 25 forms the overlapping resist part 61'.

In the printed circuit board assembly 1', the housing 5 and the overlapping resist part 61' closely contact each other in a state that the press-fit connector 3 is attached to the printed circuit board 2, and the synthetic resin 7 is filled in the inside of the through hole part 22 and the space surrounded by the overlapping resist part 61'. Thus, according to the present invention, the overlapping resist part 61' may be composed of a part of the conductive pattern 25.

In the first embodiment, the press-fit connector 3 is a multi-terminal connector. However, according to the present invention, the press-fit connector 3 may include a single press-fit terminal 4. Further, according to the present invention, the press-fit terminal 4 at least includes the main body 43a for being press-fitted into the printed circuit board 2. In this case, by changing the dipping depth and the dipping time, the synthetic resin 7 can be filled with the same facilities.

In a case that a filling process of the synthetic resin 7 into the through hole part 22 is a part of an automatic line, by changing the dipping depth and the dipping time, the through hole parts 22 of various printed circuit board assemblies having different numbers of terminals and different sectional areas can be filled into the through hole parts 22 in the same takt and the same bath. Therefore, a special machine corresponding to each kind of the printed circuit board assembly 1 is not needed.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A printed circuit board assembly comprising:
   a printed circuit board having conductive patterns formed on an insulating board, and a through hole connected to the conductive pattern;
   a press-fit connector having a press-fit terminal to be pressed into the through hole for being electrically connected to the conductive pattern, and a housing for receiving the press-fit terminal;
   an overlapping resist part formed on a press-fitting side of the printed circuit board where a resist for protecting the conductive patterns is overlapped with at least an outer edge of a circular conductive part surrounding the through hole; and
   synthetic resin for filling an inside of the through hole and a space surrounded by the overlapping resist part in a state that the press-fit connector is attached to the printed circuit board, and the housing and the overlapping resist part closely contact each other.

2. The printed circuit board assembly as claimed in claim 1,
   wherein the circular conductive part is formed by a metal plating layer extending to the press-fitting side of the printed circuit board from the inside of the through hole.

3. The printed circuit board assembly as claimed in claim 1,
   wherein the circular conductive part is formed by the conductive pattern surrounding an outer circumference of the through hole.

4. A method for producing a printed circuit board assembly, said printed circuit board assembly including:
   a printed circuit board; and
   a press-fit connector
   said printed circuit board having conductive patterns formed on an insulating board and a through hole electrically connected to the conductive patterns, a resist for protecting the conductive patterns and an overlapping resist part overlapping with at least an outer edge of a circular conductive part surrounding the through hole, said press-fit connector having a press-fit terminal to be pressed into the through hole for being electrically connected to the conductive pattern, and a housing for receiving the press-fit terminal, said method comprising the steps of:

making the overlapping resist part closely contact the housing by attaching the press-fit connector on a side where the overlapping resist part of the printed circuit board is mounted;

filling an inside of the through hole and a space surrounded by the overlapping resist part with liquid synthetic resin by dipping the printed circuit board and the press-fit connector attached to each other in a liquid synthetic resin bath in a direction from the printed circuit board to the press-fit connector; and curing the synthetic resin adhering to the printed circuit board and the press-fit connector attached to each other after pulling up the printed circuit board and the press-fit connector from the liquid synthetic resin bath.

* * * * *